(12) United States Patent
Shi et al.

(10) Patent No.: US 12,225,682 B2
(45) Date of Patent: Feb. 11, 2025

(54) TEMPERATURE ADAPTIVE INFORMATION HANDLING SYSTEM

(71) Applicant: Dell Products L.P., Round Rock, TX (US)

(72) Inventors: Zhuo Ya Shi, Beijing (CN); Xin Zhi Ma, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 226 days.

(21) Appl. No.: 18/171,466

(22) Filed: Feb. 20, 2023

(65) Prior Publication Data

US 2024/0179866 A1 May 30, 2024

(30) Foreign Application Priority Data

Nov. 24, 2022 (CN) .......................... 202211497591.9

(51) Int. Cl.
*H05K 7/20* (2006.01)
*G06F 1/20* (2006.01)
*H01L 23/38* (2006.01)

(52) U.S. Cl.
CPC ......... *H05K 7/20145* (2013.01); *G06F 1/206* (2013.01); *H01L 23/38* (2013.01); *H05K 7/20209* (2013.01)

(58) Field of Classification Search
CPC combination set(s) only.
See application file for complete search history.

(56) References Cited

U.S. PATENT DOCUMENTS

| | | | |
|---|---|---|---|
| 9,439,328 B2 * | 9/2016 | Bailey | H05K 7/20745 |
| 11,659,685 B2 * | 5/2023 | Carver | H05K 7/20272 |
| | | | 361/688 |
| 11,836,021 B2 * | 12/2023 | Zhang | G06F 1/20 |
| 12,105,568 B2 * | 10/2024 | Ma | G06F 1/203 |
| 2020/0378858 A1 * | 12/2020 | Curtis | F17D 5/06 |
| 2020/0401090 A1 * | 12/2020 | North | F28D 15/02 |
| 2022/0357722 A1 * | 11/2022 | Kelly | G06F 11/3058 |
| 2024/0179866 A1 * | 5/2024 | Shi | H05K 7/20727 |

* cited by examiner

*Primary Examiner* — Lisa Lea-Edmonds
(74) *Attorney, Agent, or Firm* — Jackson Walker L.L.P.

(57) ABSTRACT

In an information handling system, positions of a plurality of mechanical structures may be configured to be controlled to selectively direct airflow cooled by first heat-rejecting media and a thermoelectric cooler between flowing through the first exhaust plenum and flowing proximate to the one or more information handling resources and selectively direct airflow heated by the second heat-rejecting media and the thermoelectric cooler between flowing through the second exhaust plenum and flowing proximate to the one or more information handling resources.

13 Claims, 3 Drawing Sheets

TEMPERATURE ADAPTIVE INFORMATION HANDLING SYSTEM

TECHNICAL FIELD

The present disclosure relates in general to information handling systems, and more particularly to cooling of information handling system components using a thermoelectric cooling apparatus, in conjunction with airflow-based cooling.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

A particular challenge in cooling information handling systems comes in the case of "edge computing," wherein an information handling system is located, often in a remote environment, in which its surrounding ambient temperature is not climate controlled, as might be the case of a cellular base station. In some instances, ambient temperatures may fluctuate considerably among seasons, meaning cooling requirements of an information handling system may change over time. For example, for hotter ambient temperatures, the information handling system may require significant cooling to maintain electronic components at desirable operating temperatures whereas for colder ambient temperatures, it may be required to heat electronic components of the information handling system to maintain their temperatures above minimum desired temperatures.

SUMMARY

In accordance with the teachings of the present disclosure, the disadvantages and problems associated with traditional approaches to heating and cooling information handling system components may be substantially reduced or eliminated.

In accordance with embodiments of the present disclosure, an information handling system may comprise one or more information handling resources, a thermoelectric cooler, first heat-rejecting media thermally coupled to a first side of the thermoelectric cooler such that when electrical energy is applied to the thermoelectric cooler, heat is transferred from the first heat-rejecting media to the first side of the thermoelectric cooler, second heat-rejecting media thermally coupled to a second side of the thermoelectric cooler such that when electrical energy is applied to the thermoelectric cooler, heat is transferred from the second side of the thermoelectric cooler to the second heat-rejecting media, a first exhaust plenum arranged such that airflow through the first exhaust plenum is isolated from the one or more information handling resources, a second exhaust plenum arranged such that airflow through the second exhaust plenum is isolated from the one or more information handling resources and a plurality of mechanical structures arranged relative to the one or more information handling resources, the thermoelectric cooler, the first heat-rejecting media, the second heat-rejecting media, the first exhaust plenum, and the second exhaust plenum. Positions of the plurality of mechanical structures may be configured to be controlled to selectively direct airflow cooled by the first heat-rejecting media between flowing through the first exhaust plenum and flowing proximate to the one or more information handling resources and selectively direct airflow heated by the second heat-rejecting media between flowing through the second exhaust plenum and flowing proximate to the one or more information handling resources.

In accordance with these and other embodiments of the present disclosure, a method may be provided for use in an information handling system comprising one or more information handling resources, a thermoelectric cooler, first heat-rejecting media thermally coupled to a first side of the thermoelectric cooler such that when electrical energy is applied to the thermoelectric cooler, heat is transferred from the first heat-rejecting media to the first side of the thermoelectric cooler, second heat-rejecting media thermally coupled to a second side of the thermoelectric cooler such that when electrical energy is applied to the thermoelectric cooler, heat is transferred from the second side of the thermoelectric cooler to the second heat-rejecting media, a first exhaust plenum arranged such that airflow through the first exhaust plenum is isolated from the one or more information handling resources, a second exhaust plenum arranged such that airflow through the second exhaust plenum is isolated from the one or more information handling resources, and a plurality of mechanical structures arranged relative to the one or more information handling resources, the thermoelectric cooler, the first heat-rejecting media, the second heat-rejecting media, the first exhaust plenum, and the second exhaust plenum. The method may include controlling positions of the plurality of mechanical structures to selectively direct airflow cooled by the first heat-rejecting media between flowing through the first exhaust plenum and flowing proximate to the one or more information handling resources and selectively direct airflow heated by the second heat-rejecting media between flowing through the second exhaust plenum and flowing proximate to the one or more information handling resources.

In accordance with these and other embodiments of the present disclosure, an article of manufacture, may include a non-transitory computer readable medium and computer-executable instructions carried on the computer readable medium, the instructions readable by a processor, the instructions, when read and executed, for causing the processor to, in an information handling system comprising one or more information handling resources, a thermoelectric cooler, first heat-rejecting media thermally coupled to a first side of the thermoelectric cooler such that when electrical energy is applied to the thermoelectric cooler, heat is transferred from the first heat-rejecting media to the first side of the thermoelectric cooler, second heat-rejecting media thermally coupled to a second side of the thermoelectric cooler such that when electrical energy is applied to the thermoelectric cooler, heat is transferred from the second side of the thermoelectric cooler to the second heat-rejecting media, a first exhaust plenum arranged such that airflow through the first exhaust plenum is isolated from the one or more information handling resources, a second exhaust plenum arranged such that airflow through the second exhaust plenum is isolated from the one or more information handling resources, and a plurality of mechanical structures arranged relative to the one or more information handling resources, the thermoelectric cooler, the first heat-rejecting media, the second heat-rejecting media, the first exhaust plenum, and the second exhaust plenum, control positions of the plurality of mechanical structures to: selectively direct airflow cooled by the first heat-rejecting media between flowing through the first exhaust plenum and flowing proximate to the one or more information handling resources; and selectively direct airflow heated by the second heat-rejecting media between flowing through the second exhaust plenum and flowing proximate to the one or more information handling resources.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
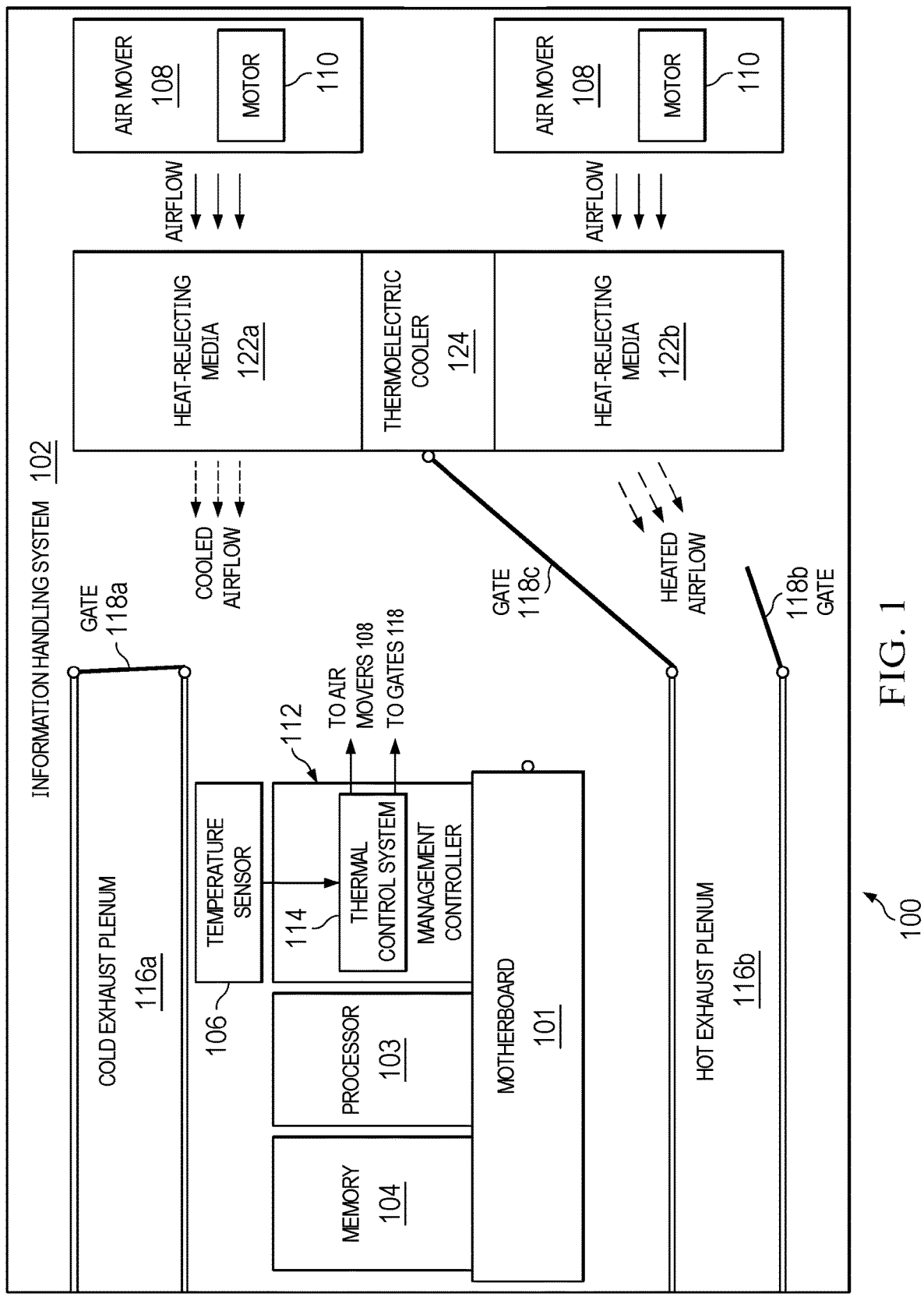
FIG. 1 illustrates a block diagram of an example information handling system in a mode for supplying cooled air to electronic components of the information handling system, in accordance with embodiments of the present disclosure.
Figure 2:
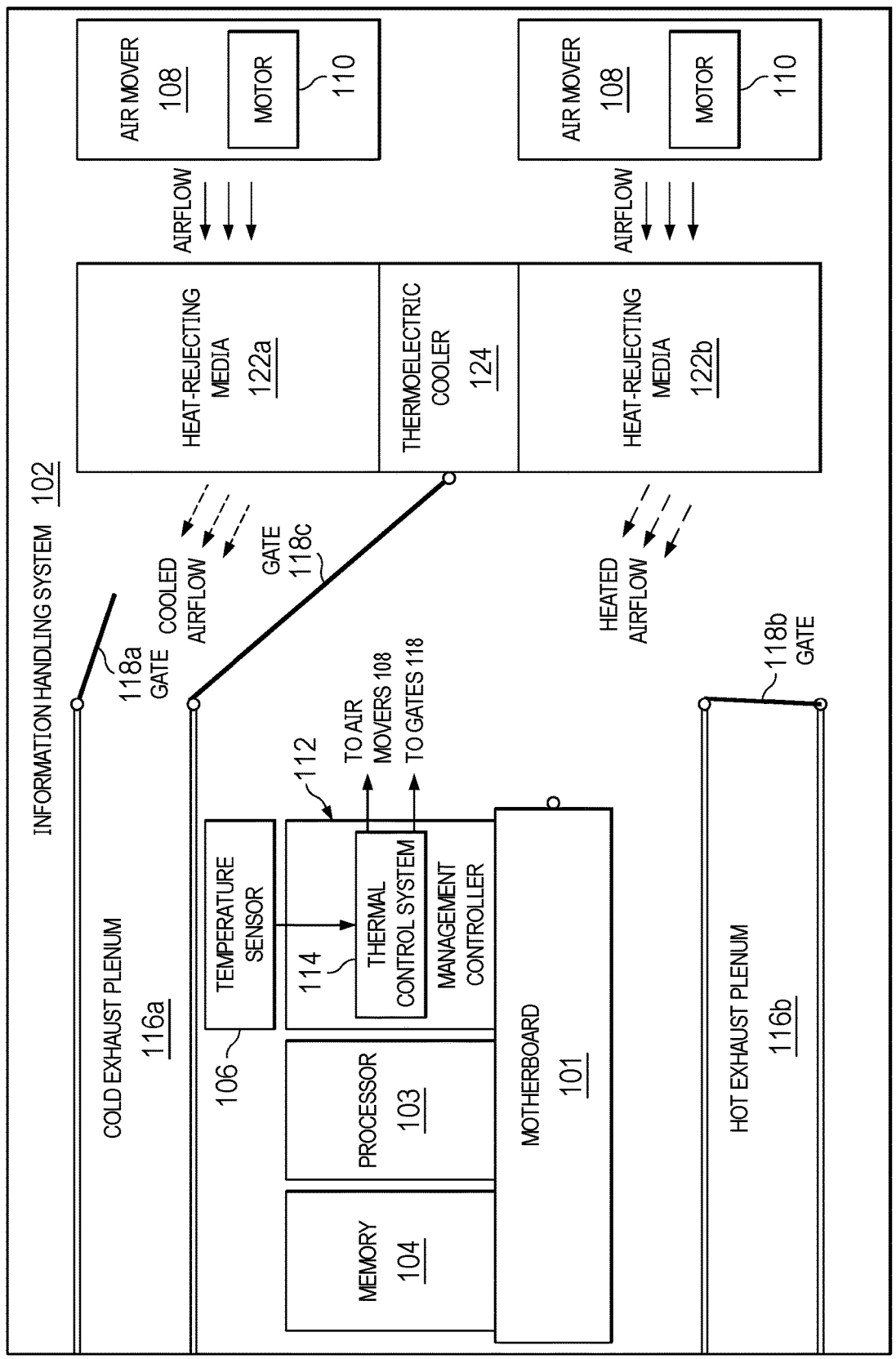
FIG. 2 illustrates a block diagram of an example information handling system in a mode for supplying heated air to electronic components of the information handling system, in accordance with embodiments of the present disclosure.
Figure 3:
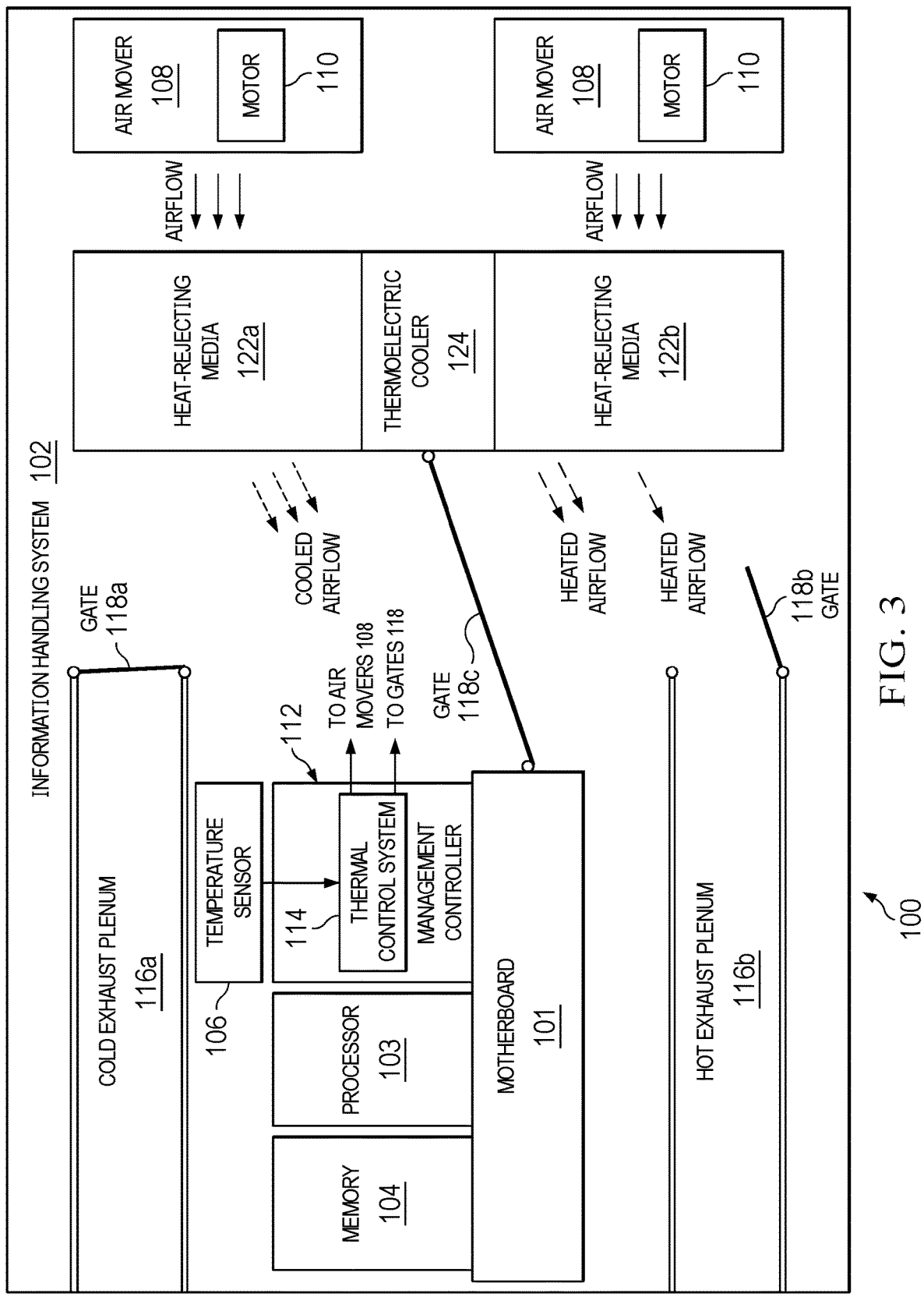
FIG. 3 illustrates a block diagram of an example information handling system in a mode for supplying air at a desire temperature to electronic components of the information handling system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing motherboard 101, a processor 103 mechanically and electrically coupled to motherboard 101, a memory 104 mechanically and electrically coupled to motherboard 101, a management controller 112 mechanically and electrically coupled to motherboard 101, a temperature sensor 106 communicatively coupled to management controller 112, a plurality of air movers 108, a cold exhaust plenum 116a, a hot exhaust plenum 116b, airflow control gates 118 (e.g., gates 118a, 118b, and 118c), heat-rejecting media 122 (e.g., heat-rejecting media 122a and 122b), and thermoelectric cooler 124.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electromechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal communicated from thermal control system 114 of management controller 112. In operation, as described in greater detail below, air mover 108 may cool or heat information handling resources of information handling system 102 by drawing air into chassis 100 from outside chassis 100, expelling air from inside chassis 100 to the outside of chassis 100, and/or moving air across heat-rejecting media 122 to cool or warm air flowing proximate to such heat-rejecting media 122.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling/heating, increase cooling/heating, or decrease cooling/heating, as appropriate, and communicate such air mover driving signal to air movers 108. In addition to thermal-based control of speeds of air movers 108, thermal control system 114 may further be configured to, as described in greater detail below, receive one or more signals indicative of one or more temperatures within information handling system 102 (e.g., one or more signals from one or more temperature sensors 106), and based on such signals, control one or more gates 118 to control flows of air through cold exhaust plenum 116a, hot exhaust plenum 116b, and electronic components of information handling system 102 located between plenums 116. In addition to thermal-based control of speeds of air movers 108 and thermal-based control of gates 118, thermal control system 114 may further be configured to, regulate thermoelectric cooler 124 based on a temperature sensed by a temperature sensors, such regulation including, without limitation, turning thermoelectric cooler 124 on or off, regulating power consumption of thermoelectric cooler 124, and/or regulating a temperature of thermoelectric cooler 124.

Temperature sensor 106 may be any system, device, or apparatus (e.g., a thermometer, thermistor, etc.) configured to communicate a signal to management controller 112 or another controller indicative of a temperature within information handling system 102. In many embodiments, information handling system 102 may comprise a plurality of temperature sensors 106, wherein each temperature sensor 106 detects a temperature of a particular component and/or location within information handling system 102. For example, in some embodiments a temperature sensor 106 may be located within, upon, or sufficiently proximate to motherboard 101 in order that any temperature measured by temperature sensor 106 is indicative of a temperature proximate to motherboard 101 and/or components mounted thereon.

Cold exhaust plenum 116a may include any suitable mechanical structure configured to guide air received through an inlet of cold exhaust plenum 116a (e.g., such inlet is proximate to gate 118a on the right side of cold exhaust plenum 116a as shown in FIG. 1) to an outlet of cold exhaust plenum 116a (e.g., at a rear of information handling system 102 on the left side of cold exhaust plenum 116a as shown in FIG. 1), such that any air flowing through cold exhaust plenum 116a is fluidically isolated from motherboard 101 and components mounted thereto.

Similarly, hot exhaust plenum 116b may include any suitable mechanical structure configured to guide air received through an inlet of hot exhaust plenum 116b (e.g., such inlet is proximate to gate 118b on the right side of hot exhaust plenum 116b as shown in FIG. 1) to an outlet of hot exhaust plenum 116b (e.g., at a rear of information handling system 102 on the left side of hot exhaust plenum 116b as shown in FIG. 1), such that any air flowing through hot exhaust plenum 116b is fluidically isolated from motherboard 101 and components mounted thereto.

Gate 118a may be located proximate to the inlet of cold exhaust plenum 116a and may comprise any suitable mechanical structure, system, device, or apparatus configured to selectively be positioned, based on one or more control signals communicated from thermal control system 114, at or between: (a) a closed position (e.g., as shown in FIG. 1) in which gate 118a substantially impedes flow of air through the inlet of cold exhaust plenum 116a, or (b) an open position (e.g., as shown in FIG. 2 described below) in which gate 118a substantially permits flow of air through the inlet of cold exhaust plenum 116a. Further, in some embodiments, gate 118a may be capable of one or more positions intermediate to its closed position and its open position.

Likewise, gate 118b may be located proximate to the inlet of hot exhaust plenum 116b and may comprise any suitable mechanical structure, system, device, or apparatus configured to selectively be positioned, based on one or more control signals communicated from thermal control system 114, at or between: (a) a closed position (e.g., as shown in FIG. 2 described below) in which gate 118b substantially impedes flow of air through the inlet of hot exhaust plenum 116b, or (b) an open position (e.g., as shown in FIG. 1) in which gate 118b substantially permits flow of air through the inlet of hot exhaust plenum 116b. Further, in some embodiments, gate 118b may be capable of one or more positions intermediate to its closed position and its open position.

Gate 118c may generally be located between heat-rejecting media 122 on one hand and motherboard 101, cold exhaust plenum 116a, and hot exhaust plenum 116b on the other hand, and may comprise any suitable mechanical structure, system, device, or apparatus configured to selectively be positioned, based on one or more control signals communicated from thermal control system 114, at or between: (a) a cooling position (e.g., as shown in FIG. 1) in which gate 118c substantially directs flow of air passing proximate to heat-rejecting media 122a to flow proximate to motherboard 101 and components mounted thereon and substantially directs flow of air passing proximate to heat-rejecting media 122b to flow through hot exhaust plenum 116b; and (b) a heating position (e.g., as shown in FIG. 2 described below) in which gate 118c substantially directs flow of air passing proximate to heat-rejecting media 122b to flow proximate to motherboard 101 and components mounted thereon and substantially directs flow of air passing proximate to heat-rejecting media 122a to flow through cold exhaust plenum 116a. Further, in some embodiments, gate 118c may be capable of one or more positions intermediate to its cooling position and its heating position.

Although not explicitly shown in the figures for purposes of clarity and exposition, each of gates 118 may include any suitable mechanical and/or electromechanical components (e.g., motors, magnets, springs, etc.) configured to position gates 118 in accordance with control signals generated by temperature control system 114.

Heat-rejecting media 122 may include any system, device, or apparatus configured to transfer heat from an information handling resource (e.g., thermoelectric cooler 124, as shown in FIG. 1), into air flowing proximate to such heat-rejecting media 122 or vice versa, thus increasing or decreasing a temperature of such air. For example, heat-rejecting media 122 may include a solid thermally coupled to the information handling resource (e.g., heatpipe, heat spreader, heatsink, finstack, etc.) such that heat or coldness generated by thermoelectric cooler 124 is transferred from thermoelectric cooler 124 into air surrounding heat-rejecting media 122 and driven by an air mover 108 or such that heat present in air surrounding heat-rejecting media 122 and driven by an air mover 108 is transferred from the air to thermoelectric cooler 124.

Thermoelectric cooler 124 may be thermally coupled to heat-rejecting media 122. Thermoelectric cooler 124 may comprise any suitable system, device, or apparatus configured to, in response to an electrical voltage applied to it, transfer heat from one side (the "cold side") of thermoelectric cooler 124 to another side (the "hot side") of thermoelectric cooler 124 in accordance with the thermoelectric effect (which may also be known as the Peltier effect, among other names). As shown in the figures, thermoelectric cooler 124 and heat-rejecting media 122a may be arranged such that the cold side of thermoelectric cooler 124 may be thermally coupled to a portion of heat-rejecting media 122a that is within an airflow path of air flowing from an air mover 108, such that thermoelectric cooler 124 cools such portion of heat-rejecting media 122a, in turn cooling the airflow passing through such portion of heat-rejecting media 122a. Similarly, thermoelectric cooler 124 and heat-rejecting media 122b may be arranged such that the hot side of thermoelectric cooler 124 may be thermally coupled to a portion of heat-rejecting media 122b that is within an airflow path of air flowing from an air mover 108, such that thermoelectric cooler 124 heats such portion of heat-rejecting media 122b, in turn heating the airflow passing through such portion of heat-rejecting media 122a.

In addition to motherboard 101, processor 103, memory 104, management controller 112, temperature sensor 106, air movers 108, cold exhaust plenum 116a, hot exhaust plenum 116b, airflow control gates 118, heat-rejecting media 122, and thermoelectric cooler 124, information handling system 102 may include one or more other information handling resources.

In operation, by selectively manipulating positions of gates 118a, 118b, and 118c, thermal control system 114 may provide cooled airflow, heated airflow, and/or airflow at a controlled temperature to electronic components of information handling system 102. For example, if a temperature sensed by temperature sensor 106 is above a maximum threshold, thermal control system 114 may cause gate 118a to be in its closed position, gate 118b to be in its open position, and gate 118c to be in its cooling position, as shown in FIG. 1. With gates 118 in such positions, cooled airflow from heat-rejecting media 122a cooled by the cold side of thermoelectric cooler 124 may be directed over electronic components of information handling system 102 while heated airflow from heat-rejecting media 122b heated by the hot side of thermoelectric cooler 124 may be directed through hot exhaust plenum 116b, such that the electronic components of information handling system 102 are cooled.

As another example, if a temperature sensed by temperature sensor 106 is below a minimum threshold, thermal control system 114 may cause gate 118a to be in its open position, gate 118b to be in its closed position, and gate 118c to be in its heating position, as shown in FIG. 2. With gates 118 in such positions, heated airflow from heat-rejecting media 122b heated by the hot side of thermoelectric cooler 124 may be directed over electronic components of information handling system 102 while cooled airflow from heat-rejecting media 122a cooled by the cold side of thermoelectric cooler 124 may be directed through cold exhaust plenum 116a, such that the electronic components of information handling system 102 are heated.

As a further example, in some embodiments it may be desirable to deliver a flow of air at a particular temperature, and based on temperature sensed by temperature sensor 106, thermal control system 114 may control gates 118a, 118bb, and 118c to provide a mix of airflow from heat-rejecting media 122a and 122b that when so mixed, provides an airflow to electronic components of information handling system 102 at or near the particular temperature. As a specific example, as shown in FIG. 3, to provide airflow at a particular desired temperature, thermal control system 114 may cause gate 118a to be in its closed position, gate 118b to be in an intermediate position between its open position and it closed position, and gate 118c to be in an intermediate position between its heating position and its cooling position, as shown in FIG. 3. With gates 118 in such positions, some of the heated airflow from heat-rejecting media 122b heated by the hot side of thermoelectric cooler 124 may be mixed with the cooled airflow from heat-rejecting media 122a cooled by the cold side of thermoelectric cooler 124 and directed over electronic components of information handling system 102 while some of heated airflow from heat-rejecting media 122b heated by the hot side of thermoelectric cooler 124 may be directed through hot exhaust plenum 116b, such that the cooled airflow and heated airflow mix to provide airflow at or near the particular desired temperature to electronic components of information handling system 102.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling system comprising:
one or more information handling resources;
a thermoelectric cooler;
first heat-rejecting media thermally coupled to a first side of the thermoelectric cooler such that when electrical energy is applied to the thermoelectric cooler, heat is transferred from the first heat-rejecting media to the first side of the thermoelectric cooler;
second heat-rejecting media thermally coupled to a second side of the thermoelectric cooler such that when electrical energy is applied to the thermoelectric cooler, heat is transferred from the second side of the thermoelectric cooler to the second heat-rejecting media;
a first exhaust plenum arranged such that airflow through the first exhaust plenum is isolated from the one or more information handling resources;
a second exhaust plenum arranged such that airflow through the second exhaust plenum is isolated from the one or more information handling resources; and
a plurality of mechanical structures arranged relative to the one or more information handling resources, the thermoelectric cooler, the first heat-rejecting media, the second heat-rejecting media, the first exhaust plenum, and the second exhaust plenum, such that positions of the plurality of mechanical structures are configured to be controlled to:
selectively direct airflow cooled by the first heat-rejecting media between flowing through the first exhaust plenum and flowing proximate to the one or more information handling resources; and
selectively direct airflow heated by the second heat-rejecting media between flowing through the second exhaust plenum and flowing proximate to the one or more information handling resources.

2. The information handling system of claim 1, further comprising one or more fans configured to impel airflow proximate to the first heat-rejecting media and the second heat-rejecting media.

3. The information handling system of claim 1, further comprising a thermal control system communicatively coupled to the plurality of mechanical structures and configured to control the positions of the plurality of mechanical structures.

4. The information handling system of claim 1, the plurality of mechanical structures comprising:
  a first mechanical structure located proximate to an inlet of the first exhaust plenum and configured to be selectively positioned between a closed position of the first mechanical structure in which the first mechanical structure substantially impedes flow of air through the inlet of the first exhaust plenum and an open position of the first mechanical structure in which the first mechanical structure substantially permits flow of air through the inlet of the first exhaust plenum; and
  a second mechanical structure located proximate to an inlet of the second exhaust plenum and configured to be selectively positioned between a closed position of the second mechanical structure in which the second mechanical structure substantially impedes flow of air through the inlet of the second exhaust plenum and an open position of the second mechanical structure in which the second mechanical structure substantially permits flow of air through the inlet of the second exhaust plenum.

5. The information handling system of claim 4, the plurality of mechanical structures further comprising a third mechanical structure located between the first heat-rejecting media and the second heat-rejecting media on one hand and the first exhaust plenum, the second exhaust plenum, and the one or more information handling resources on the other hand, the third mechanical structure configured to be selectively positioned between:
  a first position of the third mechanical structure in which the third mechanical structure substantially directs flow of air passing proximate to the first heat-rejecting media to flow proximate to the one or more information handling resources and substantially directs flow of air passing proximate to the second heat-rejecting media to flow through the second exhaust plenum; and
  a second position of the third mechanical structure in which the third mechanical structure substantially directs flow of air passing proximate to the second heat-rejecting media to flow proximate to the one or more information handling resources and substantially directs flow of air passing proximate to the first heat-rejecting media to flow through the first exhaust plenum.

6. A method, in an information handling system comprising one or more information handling resources, a thermoelectric cooler, first heat-rejecting media thermally coupled to a first side of the thermoelectric cooler such that when electrical energy is applied to the thermoelectric cooler, heat is transferred from the first heat-rejecting media to the first side of the thermoelectric cooler, second heat-rejecting media thermally coupled to a second side of the thermoelectric cooler such that when electrical energy is applied to the thermoelectric cooler, heat is transferred from the second side of the thermoelectric cooler to the second heat-rejecting media, a first exhaust plenum arranged such that airflow through the first exhaust plenum is isolated from the one or more information handling resources, a second exhaust plenum arranged such that airflow through the second exhaust plenum is isolated from the one or more information handling resources, and a plurality of mechanical structures arranged relative to the one or more information handling resources, the thermoelectric cooler, the first heat-rejecting media, the second heat-rejecting media, the first exhaust plenum, and the second exhaust plenum, the method comprising controlling positions of the plurality of mechanical structures to:
  selectively direct airflow cooled by the first heat-rejecting media between flowing through the first exhaust plenum and flowing proximate to the one or more information handling resources; and
  selectively direct airflow heated by the second heat-rejecting media between flowing through the second exhaust plenum and flowing proximate to the one or more information handling resources.

7. The method of claim 6, wherein the information handling system further comprises one or more fans configured to impel airflow proximate to the first heat-rejecting media and the second heat-rejecting media.

8. The method of claim 6, the plurality of mechanical structures comprising:
  a first mechanical structure located proximate to an inlet of the first exhaust plenum and configured to be selectively positioned between a closed position of the first mechanical structure in which the first mechanical structure substantially impedes flow of air through the inlet of the first exhaust plenum and an open position of the first mechanical structure in which the first mechanical structure substantially permits flow of air through the inlet of the first exhaust plenum; and
  a second mechanical structure located proximate to an inlet of the second exhaust plenum and configured to be selectively positioned between a closed position of the second mechanical structure in which the second mechanical structure substantially impedes flow of air through the inlet of the second exhaust plenum and an open position of the second mechanical structure in which the second mechanical structure substantially permits flow of air through the inlet of the second exhaust plenum.

9. The method of claim 8, the plurality of mechanical structures further comprising a third mechanical structure located between the first heat-rejecting media and the second heat-rejecting media on one hand and the first exhaust plenum, the second exhaust plenum, and the one or more information handling resources on the other hand, the third mechanical structure configured to be selectively positioned between:
  a first position of the third mechanical structure in which the third mechanical structure substantially directs flow of air passing proximate to the first heat-rejecting media to flow proximate to the one or more information handling resources and substantially directs flow of air passing proximate to the second heat-rejecting media to flow through the second exhaust plenum; and
  a second position of the third mechanical structure in which the third mechanical structure substantially directs flow of air passing proximate to the second heat-rejecting media to flow proximate to the one or more information handling resources and substantially directs flow of air passing proximate to the first heat-rejecting media to flow through the first exhaust plenum.

10. An article of manufacture, comprising;
a non-transitory computer readable medium; and
computer-executable instructions carried on the computer readable medium, the instructions readable by a processor, the instructions, when read and executed, for causing the processor to, in an information handling system comprising one or more information handling resources, a thermoelectric cooler, first heat-rejecting media thermally coupled to a first side of the thermoelectric cooler such that when electrical energy is applied to the thermoelectric cooler, heat is transferred from the first heat-rejecting media to the first side of the thermoelectric cooler, second heat-rejecting media thermally coupled to a second side of the thermoelectric cooler such that when electrical energy is applied to the thermoelectric cooler, heat is transferred from the second side of the thermoelectric cooler to the second heat-rejecting media, a first exhaust plenum arranged such that airflow through the first exhaust plenum is isolated from the one or more information handling resources, a second exhaust plenum arranged such that airflow through the second exhaust plenum is isolated from the one or more information handling resources, and a plurality of mechanical structures arranged relative to the one or more information handling resources, the thermoelectric cooler, the first heat-rejecting media, the second heat-rejecting media, the first exhaust plenum, and the second exhaust plenum, control positions of the plurality of mechanical structures to:
  selectively direct airflow cooled by the first heat-rejecting media between flowing through the first exhaust plenum and flowing proximate to the one or more information handling resources; and
  selectively direct airflow heated by the second heat-rejecting media between flowing through the second exhaust plenum and flowing proximate to the one or more information handling resources.

11. The article of claim 10, wherein the information handling system further comprises one or more fans configured to impel airflow proximate to the first heat-rejecting media and the second heat-rejecting media.

12. The article of claim 10, the plurality of mechanical structures comprising:
  a first mechanical structure located proximate to an inlet of the first exhaust plenum and configured to be selectively positioned between a closed position of the first mechanical structure in which the first mechanical structure substantially impedes flow of air through the inlet of the first exhaust plenum and an open position of the first mechanical structure in which the first mechanical structure substantially permits flow of air through the inlet of the first exhaust plenum; and
  a second mechanical structure located proximate to an inlet of the second exhaust plenum and configured to be selectively positioned between a closed position of the second mechanical structure in which the second mechanical structure substantially impedes flow of air through the inlet of the second exhaust plenum and an open position of the second mechanical structure in which the second mechanical structure substantially permits flow of air through the inlet of the second exhaust plenum.

13. The article of claim 12, the plurality of mechanical structures further comprising a third mechanical structure located between the first heat-rejecting media and the second heat-rejecting media on one hand and the first exhaust plenum, the second exhaust plenum, and the one or more information handling resources on the other hand, the third mechanical structure configured to be selectively positioned between:
  a first position of the third mechanical structure in which the third mechanical structure substantially directs flow of air passing proximate to the first heat-rejecting media to flow proximate to the one or more information handling resources and substantially directs flow of air passing proximate to the second heat-rejecting media to flow through the second exhaust plenum; and
  a second position of the third mechanical structure in which the third mechanical structure substantially directs flow of air passing proximate to the second heat-rejecting media to flow proximate to the one or more information handling resources and substantially directs flow of air passing proximate to the first heat-rejecting media to flow through the first exhaust plenum.

* * * * *